CIRCUIT CONSTRUCTION

Filed July 17, 1952

INVENTORS
ROBERT B. ALBRIGHT
HAROLD W. GOLDEN
BY
Brown, Denk & Synnestvedt
AGENTS United States Patent Office 2,777,193

Patented Jan. 15, 1957

2,777,193

CIRCUIT CONSTRUCTION

Robert B. Albright and Harold W. Golden, Philadelphia, Pa., assignors to Philco Corporation, Philadelphia, Pa., a corporation of Pennsylvania Application July 17, 1952, Serial No. 299,467

4 Claims. (Cl. 29—155.5)

Figure 1:
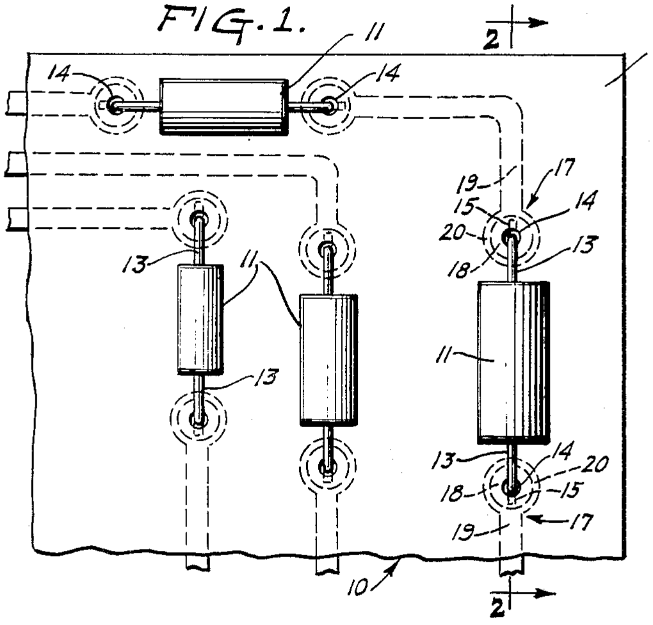

The present invention relates to electric circuit construction. Particularly, the invention herein disclosed and claimed has to do with electrical apparatus embodying so-called printed circuits and with a process or method of producing the same.

The many advantages of printed circuits are generally known, and one of the significant meritorious features of a printed circuit is that components such as transistors, condensers, resistors and like elements can be quickly associated with the printed circuitry by a dip-soldering operation. In making basic printed circuit panels, it has heretofore been proposed to utilize a base of suitable insulating material in rigid sheet form and clad with conductive metal foil. To produce printed circuitry, it is customary to outline the circuit pattern on a foil-clad panel with an insoluble acid resistant ink or paint by means of silk screening, offset printing, or other suitable transfer process. The panel is then treated with an acid solution which etches away the unprotected portions of the metal foil, the remaining portions of the foil forming the desired conductor pattern. The components are then mounted on the panel with their leads lying adjacent those points in the circuit conductors where electrical connections are to be made. Thereafter, the panel with the components arranged thereon, is immersed to a predetermined depth in a solder bath to effect such connections. According to usual procedure, the material preferred for the insulating base is one of the phenolic plastics (for example Bakelite) because such material is light in weight yet rugged in structure and can be readily worked or formed to accommodate mounting of various circuit components. A metal foil suitable to provide electrical conductors is bonded to the base panel. Aluminum foil has been used for that purpose, but since aluminum is not readily wet by solder, panels covered with aluminum foil are not suitable for solder dipping operations. When it is contemplated to effect electrical connection of circuit components with printed circuitry by dipping the assembled component and circuit panel in a bath of ordinary solder, it is preferred that the metal foil covering the base panel be one which is characterized not only by its ability to conduct electrical current but also by its ability to be wet by solder. Because copper best meets these requirements, it is the general custom to utilize copper foil as the cover for the base panel. However, the use of material such as copper foil to provide the conductor circuit has the disadvantage that when the component and panel assembly is dipped into the solder bath, the entire network of conductors becomes coated so that unnecessary waste of solder ensues. A more serious disadvantage is that globules or droplets of solder are likely to form between adjacent conductors with the result that the circuit is apt to become shorted. Thus, it is necessary that every printed circuit panel be closely inspected after solder dipping, and that any solder which adheres to adjacent conductors and forms improper connections therebetween be carefully removed.

It is an object of the present invention to overcome the above noted disadvantages by producing a printed circuit panel to which electronic components can be readily and positively connected by dipping in a bath of ordinary solder without undue waste of solder and without the danger of short-circuiting adjacent conductors.

Another and more specific object of the invention is to provide a printed circuit construction which makes it possible to effect proper solder connections between the leads of circuit components and the printed circuitry by dipping in ordinary solder, and which further assures that solder connections will result only at predetermined desired points in said circuitry.

The invention is further characterized by the novel manner in which the printed circuit is produced and in which the association of circuit components and conductor elements is accomplished.

To achieve these general objects and characteristic features, the invention employs a panel consisting of a base of insulating material clad with laminated foil which comprises an outer layer and an inner layer. In accordance with a broader aspect of the invention, both layers are made of conductive material which can be dissolved when treated with appropriate acids, but only the material of one layer is capable of readily taking up, or being wet by, solder. According to a narrower aspect of the invention, the laminated foil comprises an outer thin layer of copper over an inner thin layer of aluminum.

In carrying out the invention, the insulating panel clad with laminated foil is treated according to a novel sequence of steps. This novel sequence of steps produces a pattern of copper faced areas which serves to provide spaced points to which components can be simply but reliably connected by a solder dipping operation. Further, the novel sequence of steps produces a conductor pattern of aluminum-faced areas which electrically connect the aforesaid copper-faced points, but to which solder does not adhere following the dipping operation.

Figure 2:
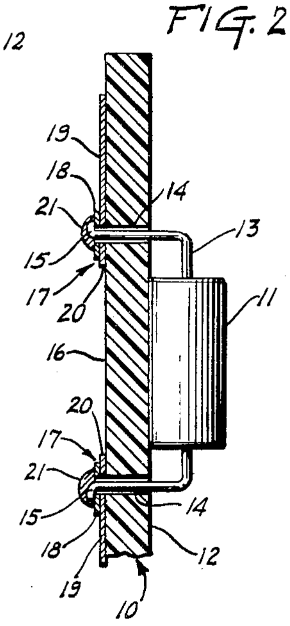

The features of the invention and the manner in which the above recited and other objects and advantages are best achieved will be fully understood from the following description of the embodiment shown in the accompanying drawings. In these drawings:

Figure 1 is a top plan view of a portion of a printed circuit panel constructed in accordance with the invention;

Figure 2 is a cross-sectional view taken substantially on line 2—2 of Figure 1; and Figures 3 through 8 are bottom plan views, on a reduced scale, illustrating successive steps in the process or method of producing a printed circuit panel as shown in Figures 1 and 2.

It is pointed out that the various figures are diagrammatic and that the thicknesses of certain elements have been exaggerated for clarity of illustration.

With more particular reference to the drawings, the printed circuit construction shown in Figures 1 and 2 includes a base 10 which is conveniently made of phenolic plastic sheet material. In the illustrated embodiment, circuit components 11 are mounted on one side, preferably the top side 12, of the panel or base. The components are provided with wire leads 13 which pass through apertures 14 in said base. As best seen in Figure 2, the end portions 15 of said wire leads project for a short distance beyond the other or bottom side 16 of the base and are adapted to overlie portions of foil material generally designated at 17. This foil material comprises an outer thin layer 18 and an inner thin layer 19, the inner layer being suitably bonded to said bottom side 16 of the base, and the outer layer being so united to the inner layer that both layers become permanently joined together to form a unitary laminated foil structure. The outer and inner layers of this laminated foil are made of conducting metallic materials, the material of the outer layer being a metal to which solder readily adheres, the metal of the inner layer being a metal to which solder does not adhere. The outer layer is conveniently made of copper although other materials such as silver, brass and the like for which solder has an affinity can be employed. The inner layer is advantageously made of aluminum, although other materials such as nickel and chromium alloys for which solder has no affinity, can be satisfactorily used. A product which has been found suitable for the purpose of the invention, comprises a metallic foil consisting of a layer of copper, a layer of aluminum and a film of zinc between the copper and the aluminum, the zinc serving as a convenient medium to assure intimate bonding between the copper and aluminum. The intermediate layer of zinc is not shown in the drawing since the zinc has no particular significance to this invention.

In the finished article as seen in Figures 1 and 2, the aluminum layer 19 forms strip-like conductors having terminal portions 20 disposed adjacent the apertures 14 in the base 16, that is to say, at predetermined points where connections are made between the circuit components and said conductors. As is also seen in Figures 1 and 2, the copper layer 18 appears only as restricted portions in the finished product, being located at connection points and disposed over terminal portions of the aluminum strip conductors. Because of this novel arrangement, during the process of effecting solder connections between said component leads and conductors, solder 21 (see Figure 2) adheres only to the end portions 15 of leads 13 and to the restricted copper portions at said connection points.

The manner in which the above described printed circuit construction is obtained, in accordance with the invention, will be best understood by referring to Figures 3 to 8 inclusive.

Figure 3:
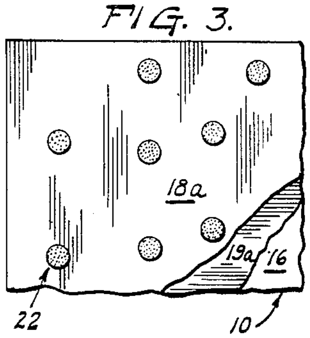

As illustrated in Figure 3, one side 16 of the panel or base 10 is completely clad with laminated foil including an outer layer of copper 18*a* and an inner layer of aluminum 19*a*. As also illustrated in Figure 3, the first step in producing the printed circuit involves the application of a dot-like pattern 22 in acid resistant ink or paint, commonly called "resist," on the exposed copper face of the base. Each dot in this pattern is located at a predetermined point where a solder connection is to be made in the manner hereafter described. The application of the dot pattern is conveniently done by means of silk screening, offset printing or other suitable known transfer process.

Figure 4:
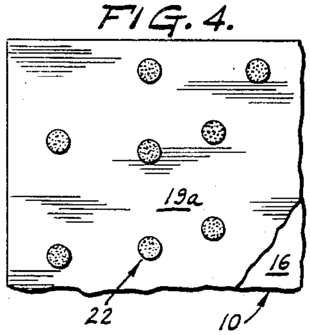

Following the application of the dot pattern, the blank is subjected to an acid treatment which etches away or dissolves the copper (also the zinc, when a product of the above mentioned type is used) except for those portions or points which are protected by the "resist" so that, as represented in Figure 4, the layer of aluminum 19*a* becomes exposed except at said portions or points defined by the dot pattern 22. A suitable medium which will dissolve the copper layer (and the zinc film) without affecting the aluminum layer is a diluted solution of nitric or acetic acid.

Figure 5:
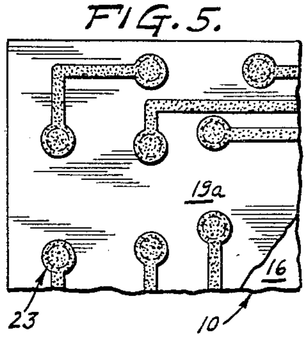

As illustrated in Figure 5, after dissolution of the copper except for the soldering-connection pattern, a conductor pattern 23 is applied on the exposed aluminum face of the blank. This conductor pattern is also conveniently outlined in "resist" by means of silk screening, offset printing, or similar known transfer processes. The printed conductor pattern is associated with the printed dot pattern according to a predetermined plan to provide the desired circuitry.

Figure 6:
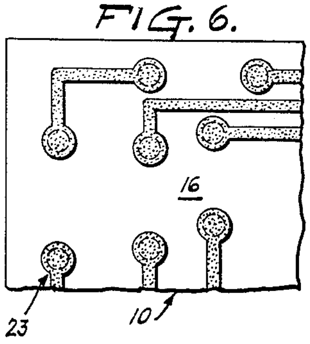

Following the application or printing of the conductor pattern, the blank is treated with an acid which etches away or dissolves the aluminum except those portions which are protected by the "resist," as is represented in Figure 6. A suitable medium which will satisfactorily dissolve the aluminum, is a mixture of sulphuric and hydrochloric acids.

Figure 7:
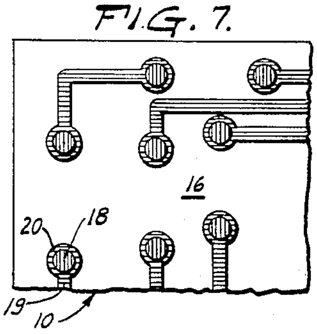

At this point in the process or method, the blank is conveniently washed or cleaned with a suitable solvent such as turpentine, benzine, etc., which removes the "resist" used to outline the dot and the conductor patterns. The removal of the "resist" leaves the blank in the condition which is represented in Figure 7 and in which the insulating base 10 is exposed, except for the restricted portions 18 of copper and the strip-like portions 19 of aluminum.

Figure 8:
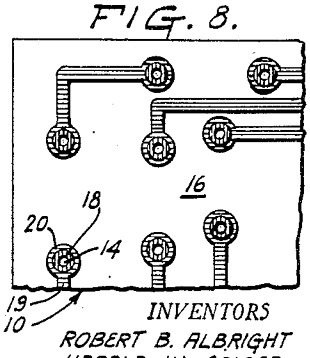

As represented in Figure 8, the final preparation of the blank for the mounting and soldering of electronic components, involves perforation of the blank to provide apertures 14 adapted to accommodate the component leads, in the manner hereinbefore described with reference to Figures 1 and 2. The perforating of the blank can be done in any suitable fashion, as by hand or machine drilling. However, the perforating of the blank is advantageously accomplished by means of a punching die designed to form, in one operation, an aperture within each area outlined by a copper faced portion.

The circuit components 11 are then mounted on the panel by inserting their leads into appropriate apertures from that side of the panel which is opposite the side on which the printed circuit is formed. To effect solder connections between these leads and their associated conductor portions, the panel is dipped in a fluxing solution and molten solder bath, at least to a depth such that the solder contacts and adheres to the copper portions 18 of the conductor pattern and the end portions 15 of the leads 13. The aluminum conducting surfaces and the exposed surface portions of the plastic base are not wet by the solder and no solder adheres thereto when the panel is withdrawn from the solder bath.

From the foregoing description, it will be appreciated that the invention greatly simplifies the production of printed circuit panels and facilitates the soldering of circuit components to the printed circuitry. The process or method according to the invention is particularly advantageous because it eliminates the possibility of solder adhering to portions of the circuit where such solder might cause a short circuit, or in any event represent a waste of material.

We claim:

1. The method of forming a printed circuit and of soldering components thereto, which method comprises bonding a layer of aluminum to one side of a sheet of insulating material and a layer of copper to said aluminum layer to form a laminated structure, selectively etching said layers to form an aluminum circuit on said one side of said sheet and copper contact areas on spaced portions of said aluminum circuit, perforating the laminated structure at the contact areas, inserting component leads through the perforations so that the components remain on the other side of the sheet and the leads are secured in contact with the contact areas, and then immersing said one side of said sheet in a molten solder bath.

2. The method of forming a printed circuit and of soldering components thereto, which method comprises forming a laminated structure by bonding to one side of a sheet of insulating material an etchable layer of conductive metal for which solder has no affinity and bonding on said layer a second etchable layer of conductive metal for which solder has an affinity, selectively etching said layers to form a circuit of the first mentioned layer on said one side of said sheet and contact areas of the second mentioned layer on spaced portions of said circuit, perforating the laminated structure at the contact areas, inserting component leads through the perforations so that the components remain on the other side of the sheet and the leads are secured in contact with the contact areas, and then immersing said one side of said sheet in a molten solder bath.

3. The method of forming a printed circuit from a laminated structure having an insulating base with a layer of aluminum bonded to one side of said base and with a layer of copper bonded to said aluminum layer, and of soldering components to said circuit, which method comprises selectively etching said layers to form an aluminum circuit on said one side of said base and copper contact areas on spaced portions of said aluminum circuit, perforating the laminated structure at the contact areas, inserting component leads through the perforations so that the components remain on the other side of the base and the leads are secured in contact with the contact areas, and then immersing said one side of said base in a molten solder bath.

4. The method of forming a printed circuit from a laminated structure having an insulating base with an etchable layer of conductive metal for which solder has no affinity bonded to one side of said base and with a second etchable layer of conductive metal for which solder has an affinity bonded to the first mentioned layer, and of soldering components to said circuit, which method comprises selectively etching said layers to form a circuit of the first mentioned layer on said one side of said base and contact areas of the second mentioned layer on spaced portions of said circuit, perforating the laminated structure at the contact areas, inserting component leads through the perforations so that the components remain on the other side of the base and the leads are secured in contact with the contact areas, and then immersing said one side of said base in a molten solder bath.

References Cited in the file of this patent

UNITED STATES PATENTS

| | | |
|---|---|---|
| 1,804,024 | Nicolas et al. | May 5, 1931 |
| 2,244,009 | Hiensch | June 3, 1941 |
| 2,246,931 | Chiffey | June 24, 1941 |
| 2,270,166 | Hiensch | Jan. 13, 1942 |
| 2,418,265 | Korpiun | Apr. 1, 1947 |
| 2,441,960 | Eisler | May 25, 1948 |
| 2,512,162 | Lips | June 20, 1950 |
| 2,513,365 | Rogoff | July 4, 1950 |
| 2,607,821 | Van Arsdell | Aug. 19, 1952 |
| 2,662,957 | Eisler | Dec. 15, 1953 |

OTHER REFERENCES

Printed Circuit Techniques, National Bureau of Standards, Circular 468, issued November 15, 1947.